(12) United States Patent
Alessio Verni et al.

(10) Patent No.: US 12,237,171 B1
(45) Date of Patent: *Feb. 25, 2025

(54) METHOD OF FORMING VANADIUM NITRIDE LAYER AND STRUCTURE INCLUDING THE VANADIUM NITRIDE LAYER

(71) Applicant: ASM IP Holding B.V., Almere (NL)

(72) Inventors: Giuseppe Alessio Verni, Ottignies (BE); Qi Xie, Wilsele (BE); Henri Jussila, Espoo (FI); Charles Dezelah, Helsinki (FI); Jiyeon Kim, Phoenix, AZ (US); Eric James Shero, Phoenix, AZ (US); Paul Ma, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/379,228

(22) Filed: Oct. 12, 2023

Related U.S. Application Data

(63) Continuation of application No. 17/113,242, filed on Dec. 7, 2020, now Pat. No. 11,885,013.

(60) Provisional application No. 62/949,307, filed on Dec. 17, 2019.

(51) Int. Cl.
*H01L 21/285* (2006.01)
*H01L 29/49* (2006.01)

(52) U.S. Cl.
CPC .... *H01L 21/28556* (2013.01); *H01L 29/4966* (2013.01)

(58) Field of Classification Search
None
See application file for complete search history.

(56) References Cited

U.S. PATENT DOCUMENTS

| | | | |
|---|---|---|---|
| 11,885,013 B2 * | 1/2024 | Alessio Verni | ......... H01L 29/43 |
| 2007/0190779 A1 | 8/2007 | Garg et al. | |
| 2012/0171847 A1 | 7/2012 | Robinson et al. | |
| 2013/0071984 A1 | 3/2013 | Wang et al. | |
| 2013/0309876 A1 * | 11/2013 | Ogawa | .................. H01L 21/318 |
| | | | 438/758 |
| 2016/0307905 A1 * | 10/2016 | Lansalot-Matras | .......................... |
| | | | H01G 13/003 |
| 2018/0286675 A1 | 10/2018 | Blomberg et al. | |
| 2019/0348515 A1 | 11/2019 | Li et al. | |
| 2020/0198967 A1 | 6/2020 | Habuka et al. | |

FOREIGN PATENT DOCUMENTS

JP    H05190548 A    7/1993

* cited by examiner

*Primary Examiner* — Shamim Ahmed
*Assistant Examiner* — Bradford M Gates
(74) *Attorney, Agent, or Firm* — Snell & Wilmer L.L.P.

(57) ABSTRACT

Methods and systems for depositing vanadium nitride layers onto a surface of the substrate and structures and devices formed using the methods are disclosed. An exemplary method includes using a cyclical deposition process, depositing a vanadium nitride layer onto a surface of the substrate. The cyclical deposition process can include providing a vanadium halide precursor to the reaction chamber and separately providing a nitrogen reactant to the reaction chamber. The cyclical deposition process may desirably be a thermal cyclical deposition process.

10 Claims, 3 Drawing Sheets

METHOD OF FORMING VANADIUM NITRIDE LAYER AND STRUCTURE INCLUDING THE VANADIUM NITRIDE LAYER

CROSS-REFERENCE TO RELATED APPLICATIONS

This application is a continuation of, and claims priority to, U.S. patent application Ser. No. 17/113,242 filed Dec. 7, 2020 titled METHOD OF FORMING VANADIUM NITRIDE LAYER AND STRUCTURE INCLUDING THE VANADIUM NITRIDE LAYER; which claims the benefit of U.S. Provisional Patent Application No. 62/949,307 filed Dec. 17, 2019 titled METHOD OF FORMING VANADIUM NITRIDE LAYER AND STRUCTURE INCLUDING THE VANADIUM NITRIDE LAYER; the disclosures of which are hereby incorporated by reference in their entirety.

FIELD OF INVENTION

The present disclosure generally relates to methods and systems suitable for forming a layer on a surface of a substrate and to structures including the layer. More particularly, the disclosure relates to methods and systems for forming layers that include vanadium nitride and to structures formed using the methods and systems.

BACKGROUND OF THE DISCLOSURE

The scaling of semiconductor devices, such as, for example, complementary metal-oxide-semiconductor (CMOS) devices, has led to significant improvements in speed and density of integrated circuits. However, conventional device scaling techniques face significant challenges for future technology nodes.

For example, one challenge has been finding a suitable conducting material for use as a gate electrode in the CMOS devices. CMOS devices have conventionally used n-type doped polysilicon as the gate electrode material. However, doped polysilicon may not be an ideal gate electrode material for advanced node applications. Although doped polysilicon is conductive, there may still be a surface region which can be depleted of carriers under bias conditions. This region may appear as an extra gate insulator thickness, commonly referred to as gate depletion, and may contribute to the equivalent oxide thickness. While the gate depletion region may be thin, on the order of a few angstroms (Å), the gate depletion region may become significant as the gate oxide thicknesses are reduced in advanced node applications. As a further example, polysilicon does not exhibit an ideal effective work function (eWF) for both NMOS and PMOS devices. To overcome the non-ideal effective work function of doped polysilicon, a threshold voltage adjustment implantation may be utilized. However, as device geometries reduce in advanced node applications, the threshold voltage adjustment implantation processes may become increasingly complex and impractical.

To overcome problems associated with doped polysilicon gate electrodes, polysilicon gate material may be replaced with an alternative material, such as, for example, a titanium nitride layer. The titanium nitride layer may provide a more ideal effective work function for CMOS applications. However, in some cases, where higher work function values than those obtained with titanium nitride layers—e.g., in PMOS regions of a CMOS device—are desired, improved materials for gate electrodes are desired. Such materials may also be suitable for other electrode/capacitor applications, such as dynamic random access memory (DRAM) applications, as well as other applications.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of forming structures including vanadium nitride layers, to structures and devices formed using such methods, and to apparatus for performing the methods and/or for forming the structures and/or devices. While the ways in which various embodiments of the present disclosure address drawbacks of prior methods and systems are discussed in more detail below, in general, various embodiments of the disclosure provide improved methods of forming vanadium nitride layers that exhibit relatively high work function values. Additionally or alternatively, vanadium nitride layers can be formed using one or more vanadium halide precursors. Further, exemplary vanadium nitride layers can be formed using a thermal cyclical deposition process-without using a plasma or plasma-activated species.

In accordance with exemplary embodiments of the disclosure, a method of forming a gate electrode structure is disclosed. Exemplary methods of forming the gate electrode structure include providing a substrate within a reaction chamber of a reactor and, using a cyclical deposition process, depositing a vanadium nitride layer onto a surface of the substrate. The cyclical deposition process can include (e.g., sequentially and separately) providing a vanadium halide precursor to the reaction chamber and providing a nitrogen reactant to the reaction chamber. The vanadium halide precursor can include one or more of a vanadium halide and a vanadium oxyhalide. The vanadium halide can be selected from the group consisting of vanadium fluoride, vanadium chloride, vanadium bromide, vanadium iodide, and the like. The vanadium oxyhalide can be selected from the group consisting of a vanadium oxyfluoride, a vanadium oxychloride, a vanadium oxybromide, a vanadium oxyiodide, and the like. The nitrogen reactant can be selected from one or more of ammonia ($NH_3$), hydrazine ($N_2H_4$), other nitrogen and hydrogen-containing gases, and the like. The cyclical deposition process can include one or more of an atomic layer deposition process and a cyclical chemical vapor deposition process. The cyclical deposition process can include a thermal process—i.e., a process that does not use plasma-activated species. Use of a thermal process may be desirable for some applications, such as formation of gate structures, because use of plasma for such applications may be detrimental to device performance.

In accordance with further exemplary embodiments of the disclosure, a method of forming a structure comprising a vanadium nitride layer includes providing a substrate within a reaction chamber of a reactor and, using a thermal cyclical deposition process, depositing a layer comprising vanadium nitride onto a surface of the substrate. The thermal cyclical deposition process can include providing a vanadium halide precursor to the reaction chamber and providing a nitrogen reactant to the reaction chamber. The vanadium halide precursor and the nitrogen reactant can be the same or similar to the vanadium halide precursor and the nitrogen reactant described above and elsewhere herein. In accordance with examples of the disclosure, the thermal cyclical deposition process does not include use of a nitrogen plasma, does not include use of excited nitrogen species, does not include use of nitrogen radicals, and/or does not include use of diatomic nitrogen as a nitrogen reactant.

In accordance with yet further exemplary embodiments of the disclosure, a structure is formed using a method as described herein. The structure can include a substrate and a vanadium nitride layer formed overlying a surface of the substrate. Exemplary structures can further include one or more additional layers, such as an additional metal or conducting layer overlying the vanadium nitride layer. The structure can be or form part of a CMOS structure, such as one or more of a PMOS and NMOS structure.

In accordance with yet additional embodiments of the disclosure, a device or portion thereof can be formed using a method and/or a structure as described herein. The device can include a substrate, an insulating or dielectric layer, a vanadium nitride layer overlying the insulating or dielectric layer, and optionally an additional metal layer overlying the vanadium nitride layer. The device can be or form part of a CMOS device.

In accordance with yet additional examples of the disclosure, a system to perform a method as described herein and/or to form a structure, device, or portion of either, is disclosed.

These and other embodiments will become readily apparent to those skilled in the art from the following detailed description of certain embodiments having reference to the attached figures. The invention is not being limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
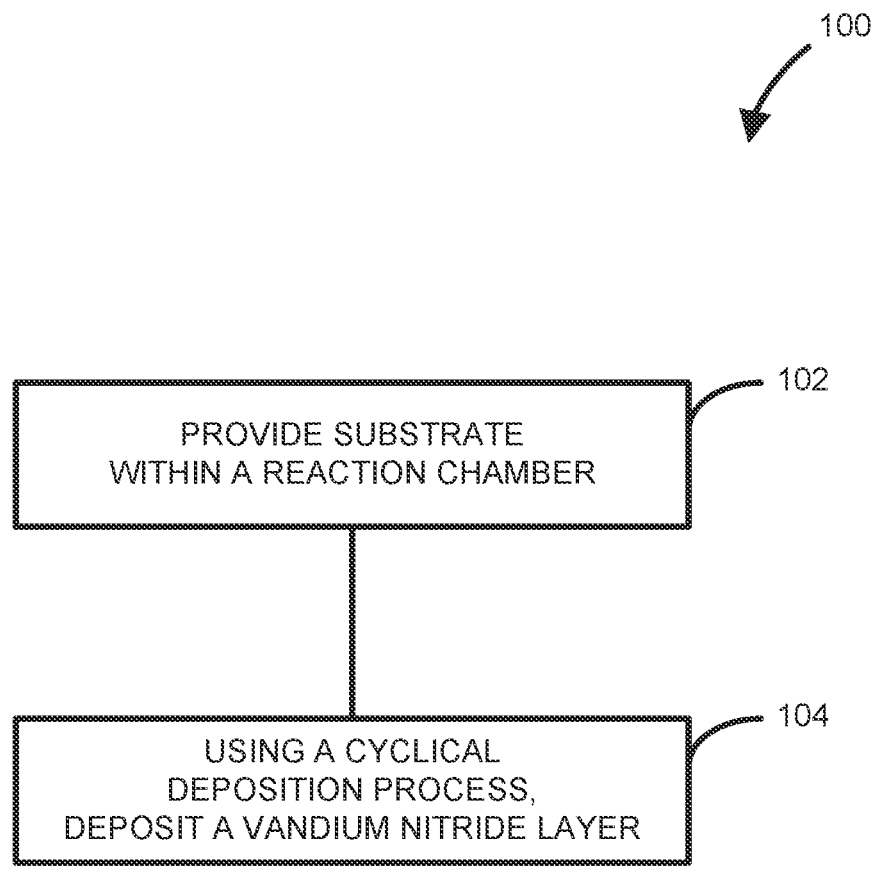
FIG. 1 illustrates a method in accordance with exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

As set forth in more detail below, various embodiments of the disclosure provide methods for forming structures, such as gate electrode structures. Exemplary methods can be used to, for example, form CMOS devices or portions thereof. However, unless noted otherwise, the invention is not necessarily limited to such examples.

Further, exemplary methods can include forming a vanadium nitride layer using a cyclical deposition process. In accordance with examples of the disclosure, a (e.g., thermal) cyclical deposition process includes providing a vanadium halide precursor to the reaction chamber and providing a nitrogen reactant to the reaction chamber. In accordance with these examples, no activated species, such as radicals, ions, or the like, are formed using a plasma.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a rare gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor. The term "inert gas" can refer to a gas that does not take part in a chemical reaction and/or does not become a part of a film matrix to an appreciable extent. Exemplary inert gases include He and Ar and any combination thereof. In some cases, nitrogen and/or hydrogen can be an inert gas.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as a Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of examples, a substrate can include bulk semiconductor material and an insulating or dielectric material layer overlying at least a portion of the bulk semiconductor material.

As used herein, the term "film" and/or "layer" can refer to any continuous or non-continuous structure and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous.

As used herein, a "structure" can be or include a substrate as described herein. Structures can include one or more layers overlying the substrate, such as one or more layers formed according to a method as described herein.

The term "cyclic deposition process" or "cyclical deposition process" can refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component.

The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, when performed with alternating pulses of precursor(s)/reactive gas(es), and purge (e.g., inert carrier) gas(es).

Generally, for ALD processes, during each cycle, a precursor is introduced to a reaction chamber and is chemisorbed to a deposition surface (e.g., a substrate surface that can include a previously deposited material from a previous ALD cycle or other material), forming about a monolayer or sub-monolayer of material that does not readily react with additional precursor (i.e., a self-limiting reaction). Thereafter, in some cases, a reactant (e.g., another precursor or reaction gas) may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

As used herein, a "vanadium nitride layer" can be a material layer that can be represented by a chemical formula that includes vanadium and nitrogen. A vanadium nitride layer can include additional elements, such as oxygen (e.g., a vanadium oxynitride layer) and the like.

As used herein, a "vanadium halide precursor" includes a gas or a material that can become gaseous and that can be represented by a chemical formula that includes vanadium and a halogen, such as one or more of fluorine (F), chlorine (Cl), bromine (Br), and iodine (I).

The term "nitrogen reactant" can refer to a gas or a material that can become gaseous and that can be represented by a chemical formula that includes nitrogen. In some cases, the chemical formula includes nitrogen and hydrogen. In some cases, the nitrogen reactant does not include diatomic nitrogen.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

Turning now to the figures, FIG. 1 illustrates a method 100 in accordance with exemplary embodiments of the disclosure. Method 100 can be used to, for example, form a gate electrode structure suitable for NMOS, PMOS, and/or CMOS devices. However, unless otherwise noted, methods are not limited to such applications.

Method 100 includes the steps of providing a substrate within a reaction chamber of a reactor (step 102) and using a cyclical deposition process, depositing a layer comprising vanadium nitride onto a surface of the substrate (step 104).

During step 102, a substrate is provided within a reaction chamber. The reaction chamber used during step 102 can be or include a reaction chamber of a chemical vapor deposition reactor system configured to perform a cyclical deposition process. The reaction chamber can be a stand-alone reaction chamber or part of a cluster tool.

Step 102 can include heating the substrate to a desired deposition temperature within the reaction chamber. In some embodiments of the disclosure, step 102 includes heating the substrate to a temperature of less than 800° C. For example, in some embodiments of the disclosure, heating the substrate to a deposition temperature may comprise heating the substrate to a temperature between approximately 20° C. and approximately 800° C.

In addition to controlling the temperature of the substrate, a pressure within the reaction chamber may also be regulated. For example, in some embodiments of the disclosure, the pressure within the reaction chamber during step 102 may be less than 760 Torr or between 10 Torr and 760 Torr.

During step 104, a vanadium nitride layer is deposited onto a surface of the substrate using a cyclical deposition process. As noted above, the cyclical deposition process can include cyclical CVD, ALD, or a hybrid cyclical CVD/ALD process. For example, in some embodiments, the growth rate of a particular ALD process may be low compared with a CVD process. One approach to increase the growth rate may be that of operating at a higher deposition temperature than that typically employed in an ALD process, resulting in some portion of a chemical vapor deposition process, but still taking advantage of the sequential introduction of reactants. Such a process may be referred to as cyclical CVD. In some embodiments, a cyclical CVD process may comprise the introduction of two or more reactants into the reaction chamber, wherein there may be a time period of overlap between the two or more reactants in the reaction chamber resulting in both an ALD component of the deposition and a CVD component of the deposition. This is referred to as a hybrid process. For example, a cyclical deposition process may comprise the continuous flow of one reactant and the periodic pulsing of a second reactant into the reaction chamber.

In accordance with examples of the disclosure, the cyclical deposition process is a thermal deposition process. In these cases, the cyclical deposition process does not include use of a plasma to form activated species for use in the cyclical deposition process. For example, the cyclical deposition process may not comprise formation or use of a nitrogen plasma, may not comprise formation or use of excited nitrogen species, and/or may not comprise formation or use or nitrogen radicals.

The cyclical deposition process can include (e.g., separately and/or sequentially) providing a vanadium halide precursor to the reaction chamber and providing a nitrogen reactant to the reaction chamber. The vanadium halide precursor can include one or more of a vanadium halide and a vanadium oxyhalide. By way of examples, the vanadium halide can be selected from one or more of a vanadium fluoride, a vanadium chloride, a vanadium bromide, and a vanadium iodide. The vanadium halide can include only vanadium and one or more halogens. By way of example, the vanadium halide can include vanadium tetrachloride or the like. The vanadium oxyhalide can be selected from one or more of vanadium oxyhalides, such as one or more of a vanadium oxyfluoride, a vanadium oxychloride, a vanadium oxybromide, and a vanadium oxyiodide. The vanadium oxyhalide can include only vanadium, oxygen, and one or more halides. By way of example, the vanadium oxyhalide can include vanadium oxytrichloride or the like. Use of vanadium halide precursors can be advantageous relative to methods that use other precursors, such as vanadium metalorganic precursors, because the vanadium halide precursors can be relatively inexpensive, can result in vanadium nitride layers with lower concentrations of impurities, such as carbon, and/or processes that use such precursors can be more controllable-compared to processes that use metalorganic or other vanadium precursors. Further, such reactants can be used without the assistance of a plasma to form excited species. In addition, processes that use vanadium halide may be easier to scale up, compared to methods that use organometallic vanadium precursors.

The nitrogen reactant can be or include one or more of ammonia ($NH_3$), hydrazine ($N_2H_4$), or the like. The nitrogen reactant can include or consist of nitrogen and hydrogen. In some cases, the nitrogen reactant does not include diatomic nitrogen. In the case of thermal cyclical deposition processes, a duration of the step of providing nitrogen reactant to the reaction chamber can be relatively long to allow the nitrogen reactant to react with the precursor or a derivative thereof. For example, the duration can be greater than or equal to 5 seconds or greater than or equal to 10 seconds or between about 5 and 10 seconds.

As part of step 104, the reaction chamber can be purged using a vacuum and/or an inert gas, to mitigate gas phase reactions between reactants and enable self-saturating surface reactions—e.g., in the case of ALD. Additionally or alternatively, the substrate may be moved to separately contact a first vapor phase reactant and a second vapor phase reactant. Surplus chemicals and reaction byproducts, if any, can be removed from the substrate surface or reaction chamber, such as by purging the reaction space or by moving the substrate, before the substrate is contacted with the next reactive chemical. The reaction chamber can be purged after the step of providing a vanadium halide precursor to the reaction chamber and/or after the step of providing a nitrogen reactant to the reaction chamber.

In some embodiments of the disclosure, method 100 includes repeating a unit deposition cycle that includes (1) providing a vanadium halide precursor to the reaction chamber and (2) providing a nitrogen reactant to the reaction chamber, with optional purge or move steps after step (1) and/or (2). The deposition cycle can be repeated one or more times, based on, for example, desired thickness of the vanadium nitride layer. For example, if the thickness of the vanadium nitride layer is less than desired for a particular application, then the step of providing a vanadium halide precursor to the reaction chamber and providing a nitrogen reactant to the reaction chamber can be repeated one or more times. Once the vanadium nitride layer has been deposited to a desired thickness, the substrate can be subjected to additional processes to form a device structure and/or device.

In some embodiments, a step coverage of the vanadium nitride layer is equal to or greater than about 50%, or greater than about 80%, or greater than about 90%, or about 95%, or about 98%, or about 99% or greater, in/on structures having aspect ratios (height/width) of more than about 2, more than about 5, more than about 10, more than about 25, more than about 50, or even more than about 100.

Figure 2:
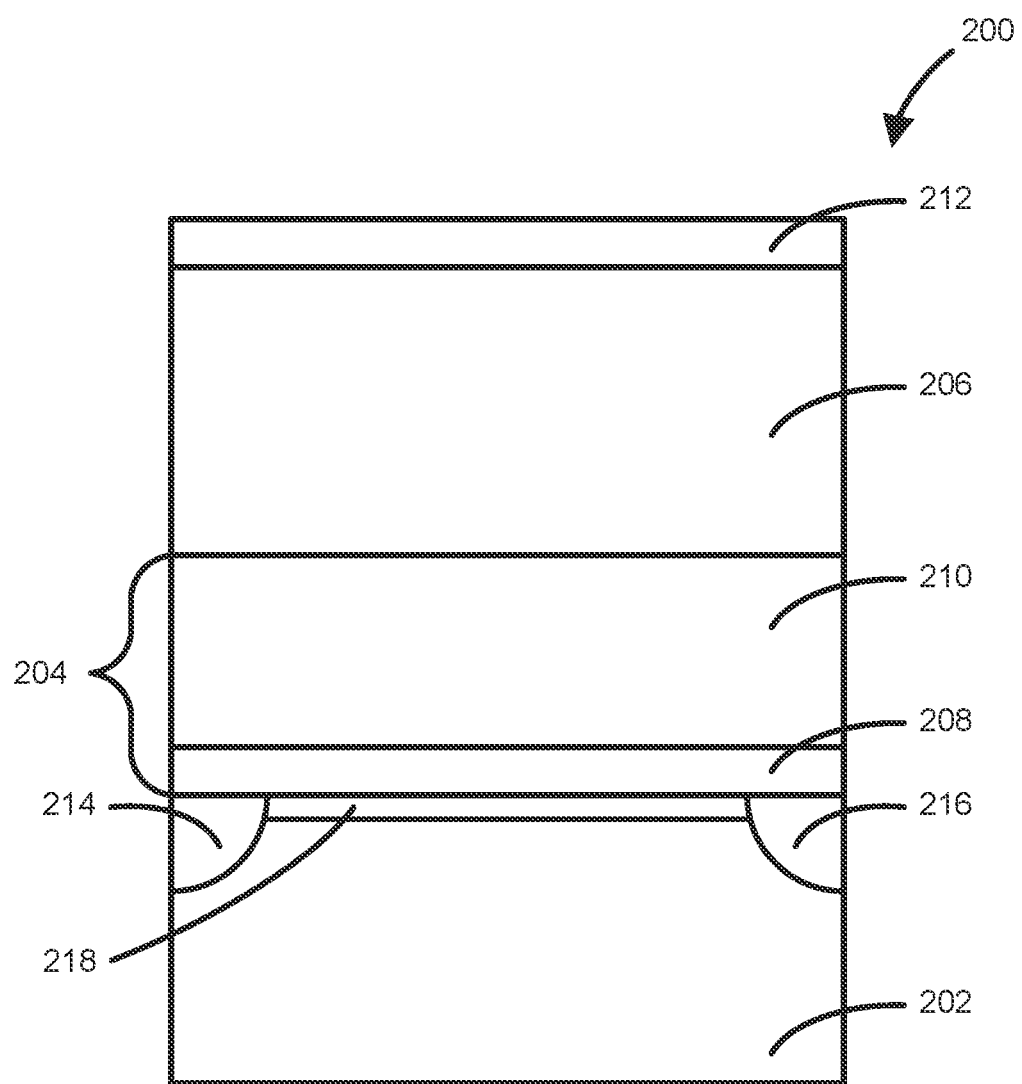
FIG. 2 illustrates a structure/device portion in accordance with exemplary embodiments of the disclosure.

FIG. 2 illustrates a structure/a portion of a device 200 in accordance with additional examples of the disclosure. of a device or structure 200 includes a substrate 202, dielectric or insulating material 204, and vanadium nitride layer 206. In the illustrated example, structure 200 also includes an additional conducting layer 212.

Substrate 202 can be or include any of the substrate material described herein. In the illustrated example, substrate 202 includes a source region 214, a drain region 216, and a channel region 218. Although illustrated as a horizontal structure, structures and devices in accordance with examples of the disclosure can include vertical and/or three-dimensional structures and devices, such as FinFET devices.

Dielectric or insulating material 204 can include one or more dielectric or insulating materials suitable for gate structure applications. By way of example, dielectric or insulating material 204 can include an interface layer 208 and a high-k material 210 deposited overlying interface layer 208. In some cases, interface layer 208 may not exist or may not exist to an appreciable extent. Interface layer 208 can include an oxide, such as a silicon oxide, which can be formed on a surface of the substrate 202 using, for example a chemical oxidation process or an oxide deposition process. High-k material 210 can be or include, for example, a metallic oxide having a dielectric constant greater than approximately 7. In some embodiments, the high-k material includes has a dielectric constant higher than the dielectric constant of silicon oxide. Exemplary high-k materials include one or more of hafnium oxide ($HfO_2$), tantalum oxide ($Ta_2O_5$), zirconium oxide ($ZrO_2$), titanium oxide ($TiO_2$), hafnium silicate ($HfSiO_x$), aluminum oxide ($Al_2O_3$) or lanthanum oxide ($La_2O_3$), or mixtures/laminates thereof.

Vanadium nitride layer 206 can be formed according to a method described herein. Because vanadium nitride layer 206 is formed using a cyclical deposition process, a concentration of vanadium and/or nitrogen can vary from a bottom of vanadium nitride layer 206 to a top of vanadium nitride layer 206 by, for example, controlling an amount of vanadium halide precursor and/or nitrogen reactant and/or respective pulse times during one or more deposition cycles. In some cases, vanadium nitride layer 206 can have a stochiometric composition. A work function and other properties of vanadium nitride layer 206 can be altered by altering an amount of nitrogen and/or vanadium in the layer or in a deposition cycle.

Vanadium nitride layer 206 can include oxygen. For example, vanadium nitride layer 206 can be or include a vanadium oxynitride layer. Vanadium nitride layer 206 can include impurities, such as halides, hydrogen or the like in an amount of less than one atomic percent, less than 0.2 atomic percent, or less than about 0.1 atomic percent, or less than 0.05 atomic percent, alone or combined.

A work function of vanadium nitride layer 206 can be >4.6 eV, >4.7 eV, >4.8 eV, >4.9 eV, >4.95 eV, or >5.0 eV. Additionally or alternatively, vanadium nitride layer 206 can form a continuous film—e.g., using method 100—at a thickness of less than <5 nm, <4 nm, <3 nm, <2 nm, <1.5 nm, <1.2 nm, <1.0 nm, or <0.9 nm. Vanadium nitride layer 206 can be relatively smooth, with relatively low grain boundary formation. In some cases, vanadium nitride layer 206 may be amorphous, with relatively low columnar crystal structures (as compared to TiN). RMS roughness of exemplary vanadium nitride layer 206 can be <1.0 nm, <0.7 nm, <0.5 nm, <0.4 nm, <0.35 nm, <0.3 nm, at a thickness of less than 10 nm.

Additional conducting layer 212 can include, for example, metal, such as a refractory metal or the like.

Figure 3:
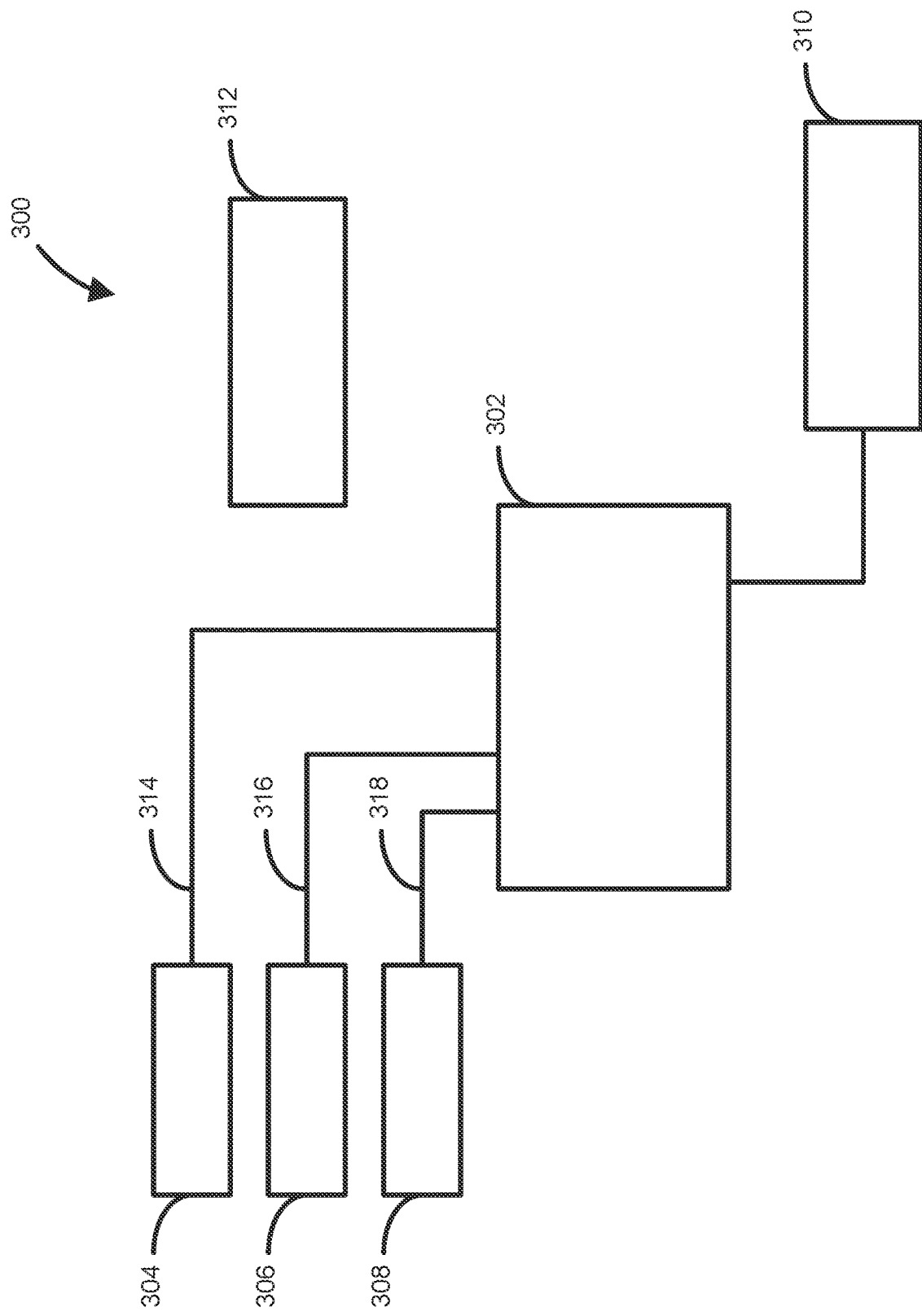
FIG. 3 illustrates a reactor system in accordance with additional exemplary embodiments of the disclosure.

FIG. 3 illustrates a system 300 in accordance with yet additional exemplary embodiments of the disclosure. System 300 can be used to perform a method as described herein and/or form a structure or device portion as described herein.

In the illustrated example, system 300 includes one or more reaction chambers 302, a precursor gas source 304, a nitrogen reactant gas source 306, a purge gas source 308, an exhaust source 310, and a controller 312.

Reaction chamber 302 can include any suitable reaction chamber, such as an ALD or CVD reaction chamber.

Precursor gas source 304 can include a vessel and one or more vanadium halide precursors as described herein—alone or mixed with one or more carrier (e.g., inert) gases. Nitrogen reactant gas source 306 can include a vessel and one or more nitrogen reactants as described herein—alone or mixed with one or more carrier gases. Purge gas source 308 can include one or more inert gases as described herein. Although illustrated with three gas sources 304-308, system 300 can include any suitable number of gas sources. Gas sources 304-308 can be coupled to reaction chamber 302 via lines 314-318, which can each include flow controllers, valves, heaters, and the like.

Exhaust source 310 can include one or more vacuum pumps.

Controller 312 includes electronic circuitry and software to selectively operate valves, manifolds, heaters, pumps and other components included in the system 300. Such circuitry and components operate to introduce precursors, reactants, and purge gases from the respective sources 304-308. Controller 312 can control timing of gas pulse sequences, temperature of the substrate and/or reaction chamber, pressure within the reaction chamber, and various other operations to provide proper operation of the system 300. Controller 312 can include control software to electrically or pneumatically control valves to control flow of precursors, reactants and purge gases into and out of the reaction chamber 302. Controller 312 can include modules such as a software or hardware component, e.g., a FPGA or ASIC, which performs certain tasks. A module can advantageously be configured to reside on the addressable storage medium of the control system and be configured to execute one or more processes.

Other configurations of system 300 are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into reaction chamber 302. Further, as a schematic representation of a system, many components have been omitted for simplicity of illustration, and such components may include, for example, various valves, manifolds, purifiers, heaters, containers, vents, and/or bypasses.

During operation of reactor system 300, substrates, such as semiconductor wafers (not illustrated), are transferred from, e.g., a substrate handling system to reaction chamber 302. Once substrate(s) are transferred to reaction chamber 302, one or more gases from gas sources 304-308, such as precursors, reactants, carrier gases, and/or purge gases, are introduced into reaction chamber 302.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of forming a gate electrode structure, the method comprising the steps of:
providing a substrate within a reaction chamber of a reactor; and
using a cyclical deposition process, depositing a vanadium nitride layer onto a surface of the substrate,
wherein a cycle of the cyclical deposition process consists of:
providing a vanadium precursor to the reaction chamber; and
providing a nitrogen reactant to the reaction chamber, and
purging the chamber using a vacuum and/or an inert gas, and
wherein the cyclical deposition process comprises continuously providing the vanadium precursor and periodically providing the nitrogen reactant.

2. The method of claim 1, wherein the nitrogen reactant is selected from one or more of ammonia ($NH_3$), hydrazine ($N_2H_4$), and other compounds comprising or consisting of nitrogen and hydrogen.

3. The method of claim 1, wherein during the step of providing a nitrogen reactant to the reaction chamber, diatomic nitrogen is not provided.

4. The method of claim 1, wherein the vanadium precursor is a vanadium halide precursor.

5. The method of claim 1, wherein the cyclical deposition process comprises a cyclical chemical vapor deposition process.

6. The method of claim 1, wherein a temperature of the substrate within the reaction chamber during the cyclical deposition process is between about 20° C. and about 800° C.

7. The method of claim 1, wherein the cyclical deposition process is a thermal cyclical deposition process.

8. The method of claim 1, wherein the cyclical deposition process does not comprise use of a nitrogen plasma, nitrogen radicals, or excited nitrogen species.

9. The method of claim 1, wherein the vanadium nitride layer includes halides and hydrogen in an amount of less than one atomic percent.

10. A structure comprising a vanadium nitride layer formed according to the method of claim 1.

* * * * *